United States Patent
Yuen et al.

(10) Patent No.: US 9,605,193 B2
(45) Date of Patent: Mar. 28, 2017

(54) THREE DIMENSIONAL INTERCONNECTED POROUS GRAPHENE-BASED THERMAL INTERFACE MATERIALS

(71) Applicant: The Hong Kong University of Science and Technology, Kowloon, Hong Kong (CN)

(72) Inventors: Matthew Ming Fai Yuen, Hong Kong (CN); Xinfeng Zhang, Hong Kong (CN); Kan Kan Yeung, Hong Kong (CN); Zhaoli Gao, Hong Kong (CN); Kai Zhang, Hong Kong (CN); Min Zhang, Hong Kong (CN); Huansu Xu, Hong Kong (CN)

(73) Assignee: THE HONG KONG UNIVERSITY OF SCIENCE AND TECHNOLOGY, Kowloon, Hong Kong (CN)

( * ) Notice: Subject to any disclaimer, the term of this patent is extended or adjusted under 35 U.S.C. 154(b) by 26 days.

(21) Appl. No.: 14/057,233

(22) Filed: Oct. 18, 2013

(65) Prior Publication Data

US 2014/0110049 A1   Apr. 24, 2014

Related U.S. Application Data

(60) Provisional application No. 61/795,536, filed on Oct. 19, 2012.

(51) Int. Cl.
   *C09K 5/14*    (2006.01)
   *C01B 31/04*   (2006.01)
   (Continued)

(52) U.S. Cl.
   CPC ............ *C09K 5/14* (2013.01); *C01B 31/043* (2013.01); *C01B 31/0438* (2013.01);
   (Continued)

(58) Field of Classification Search
   CPC ........................................................ C09K 5/14
   See application file for complete search history.

(56) References Cited

U.S. PATENT DOCUMENTS

2003/0037906 A1*  2/2003  Delano ............... H01L 23/4093
                                                          165/80.3
2008/0248275 A1*  10/2008  Jang et al. .................... 428/220
(Continued)

FOREIGN PATENT DOCUMENTS

| CN | 102674321 A | 9/2012 |
| CN | 102701188 A | 10/2012 |
| WO | 2008143692 A1 | 11/2008 |

OTHER PUBLICATIONS

Translation of Abstract of CN 102674321, Chen et al., Sep. 19, 2012, 4 pages.*

(Continued)

*Primary Examiner* — Hai Vo
(74) *Attorney, Agent, or Firm* — Nath, Goldberg & Meyer; Jerald L. Meyer; Stanley N. Protigal (57) ABSTRACT

A thermal interface material provides thermal conduction or thermal dissipation across an interface, using a three-dimensional interconnected porous graphene (3D-IPG) foam structure. The 3D-IPG foam structure is constructed of three-dimensional interconnected graphene sheets formed as a plurality of monolayers, and having an flexible interconnection architecture. The flexible interconnection architectures allow the 3D-IPG to maintain a high interfacial thermal conductance by the 3D-IPG filling a gap between a heat source and a heat sink across the interface, and by capping small features up to nanoscale roughened surfaces.

14 Claims, 4 Drawing Sheets

(51) Int. Cl.
H01L 23/373 (2006.01)
B82Y 40/00 (2011.01)
B82Y 30/00 (2011.01)

(52) U.S. Cl.
CPC ............ H01L 23/373 (2013.01); B82Y 30/00 (2013.01); B82Y 40/00 (2013.01); H01L 2924/0002 (2013.01); Y10T 156/10 (2015.01); Y10T 428/265 (2015.01); Y10T 428/30 (2015.01)

(56) References Cited

U.S. PATENT DOCUMENTS

| | | | |
|---|---|---|---|
| 2010/0128439 A1 | 5/2010 | Tilak et al. | |
| 2010/0140792 A1 | 6/2010 | Haddon et al. | |
| 2012/0322917 A1* | 12/2012 | Alcazar Jorba | C01B 31/0438 523/468 |

OTHER PUBLICATIONS

Khan M. F. Shahil, et al., "Graphene-Multilayer Graphene Nanocomposites as Highly Efficient Thermal Interface Materials", Nano Letters, American Chemical Society Publications, pp. 861-867, (Jan. 3, 3012).

Michael Thompson Pettes, et al., "Thermal Transport in Three Dimensional Foam Architectures of Few-Layer Graphene and Ultrathin Graphite", Nano Letters, American Chemical Society Publications, pp. 2959-2964, (May 21, 2012).

Zongping Chen, et al., "Three-dimensional flexible and conductive interconnected graphene networks grown by chemical vapour deposition", Nature Materials Letters, Macmillan Publishers Limited, pp. 1-5, (Apr. 10, 2011).

K Zhang, et al., "Carbon nanotube thermal interface material for high-brightness light-emitting-diode cooling", Nanotechnology, IOP Publishing Ltd., vol. 19, pp. 1-8, (Apr. 23, 2008).

Z L Gao, et al., "Fabrication of carbon nanotube thermal interface material on aluminum alloy substrates with low pressure CVD", Nanotechnology, IOP Publishing Ltd., vol. 22, pp. 1-8, (May 17, 2011).

Hongyuan Chen, et al., "Architecting Three-Dimensional Networks in Carbon Nanotube Buckypapers for Thermal Interface Materials", Journal of Physical Chemistry, American Chemical Society Publications, vol. 116, pp. 3903-3909, (Jan. 18, 2012).

Qizhen Liang, et al., "A Three-Dimensional Vertically Aligned Fuctionalized Multilayer Graphene Architecture: An Approach for Graphene-Based Thermal Interfacial Materials", ACS Nano, American Chemical Society Publications, vol. 5, pp. 2392-2401, (Mar. 8, 2011).

Fang, et al, Synthesis, Decoration and Properties of Three-Dimensional Graphene-Based Macrostructures: A review, Chemical Engineering Journal, vol. 264, pp. 753-771, 2015.

Cao, et al, Three-Dimensional Graphene Materials: preparation, structures and application in supercapacitors, Energy & Environmental Science, vol. 7, pp. 1850-1865, 2014.

Nanoscale, vol. 6, No. 4, pp. 1903-2456, Feb. 21, 2014.

Yanfeng Ma, et al., Three-dimensional Graphene Networks: synthesis, properties and applications, National Science Review Advance Access, Nov. 10, 2014.

Pettes, et al., "Thermal Transport in Three-Dimensional Foam Architectures of Few-Layer Graphene and Ultrathin Graphite", dx.doi.org/10.1021/nl300662q | Nano Lett. 2012, 12, 2959-2964 (American Chemical Society, 2012).

Pettes, et al., "Supporting Information for (DOI: 10.1021/nl300662q):—Thermal Transport in Three-Dimensional Foam Architectures of Few-Layer Graphene and Ultrathin Graphite", University of Texas at Austin, Austin, Texas.

Zhang, et al., "Exceptional thermal interface properties of a three-dimensional graphene foam", Carbon 66 (2014) 201-20.

Zhao, et al., "Study on thermal properties of graphene foam/graphene sheets filled polymer composites", Composites: Part A 72 (2015) 200-206 (2015 Elsevier Ltd.).

Zhao, et al., "Synergic enhancement of thermal properties of polymer composites by graphene foam and carbon black", Composites Part B 84 (2016) 52-58 (2015 Elsevier Ltd.).

Jiang, "Heat collection and supply of interconnected netlike graphene/polyethyleneglycol composites for thermoelectric devices" Nanoscale, 2015, 7, 10950-10953 (The Royal Society of Chemistry 2015).

He, "Freestanding Three-Dimensional Graphene/MnO2 Composite Networks as Ultralight and Flexible Supercapacitor Electrodes" ACS Nano, vol. 7, No. 1, 174-182, 2013 (copyright 2012, American Chemical Society).

He, "Supporting Information—Free-Standing Three-Dimensional Graphene/MnO2 Composite Networks as Ultra-Light and Flexible Supercapacitor Electrodes", School of Physical Science and Technology, Lanzhou University, Lanzhou 730000, People's Republic of China (2013).

* cited by examiner

Fig. 8

THREE DIMENSIONAL INTERCONNECTED POROUS GRAPHENE-BASED THERMAL INTERFACE MATERIALS

RELATED APPLICATION(S)

The present patent application claims priority to Provisional Patent Application No. 61/795,536 filed Oct. 19, 2012, which is assigned to the assignee hereof and filed by the inventors hereof and which is incorporated by reference herein.

BACKGROUND

Field

The present disclosure relates to a thermal management system with three-dimensional interconnected porous graphene (3DX-IPG) nanostructured films used as thermal interface materials (TIMs).

Background

Graphene is a one atomic layer sheet of carbon atoms with double electron bonds. It is reported that graphene has ultra-high thermal conductivity (~4000 W/m·K). Graphene and its chemical derivatives such as graphene oxide and reduced graphene oxide have been widely used as conductive fillers in polymer matrices to produce thermal conductive composites. The thermal conductivity of graphene-based composites is typically much lower than the bulk thermal conductivity of graphene, and may not display significant advantages over conventional composite-based thermal interface materials (TIMs). Chemically or physically bonded graphene paper has been proposed as a thermal interface material. The graphene paper is typically produced from chemically exfoliated graphene, and typically suffers from the poor thermal conductivity due to the defects generated in graphene sheets during the chemical exfoliation process. Furthermore, the chemical derivative graphene sheets in graphene paper are typically stacked in parallel, resulting in anisotropic in thermal transport and limiting the thermal transport in the vertical direction.

The use of graphene foam (GF) was described by Chen Z P, Ren W C, Gao L B, Liu B L, Pei S F, Cheng H M. Three-dimensional flexible and conductive interconnected graphene networks grown by chemical vapour deposition, Nat. Mater. 2011; 10: 424-428. That reference describes the production or manufacturing method for GF.

SUMMARY

A thermal interface material (TIM) is constructed and used for increasing thermal conduction or thermal dissipation across an interface. The TIM is made from a three-dimensional interconnected porous graphene (3D-IPG) foam structure constructed of three-dimensional interconnected graphene sheets formed as a plurality of monolayers or few layers. The graphene sheets have an flexible interconnection architecture, in which the flexible interconnection architectures allow the 3D-IPG to maintain a high interfacial thermal conductance by the 3D-IPG filling a gap between a heat source and a heat sink across the interface, and by capping small features up to nanoscale roughened surfaces.

The 3D-IPG foam structure provides a flexible interconnection architectures, allowing the 3D-IPG to maintain a high interfacial thermal conductance by the 3D-IPG filling a gap between a heat source and a heat sink across the interface, thereby reducing thermal resistance between the mating surfaces and providing high thermal conductivity and a high surface area to 3D-IPG function as an effective heat dissipater, heat sink or heat convector.

BRIEF DESCRIPTION OF THE DRAWINGS

FIGS. 5A and 5B are images of 3D-IPG film.

FIGS. 7A and B are digital photo images of the materials after disassembly following a thermal resistance test.

DETAILED DESCRIPTION

Overview

The present disclosure describes a thermal management system using thermal interface materials made from interconnected 3D graphene nanostructured films. This disclosure demonstrates superior heat dissipation performance of three-dimensional interconnected porous graphene (3DX-IPG) as thermal interface materials (TIMs). Several thermal management systems based on 3D-IPG film are provided.

Three-dimensional (3D) interconnected porous graphene (IPG) nanostructured films are used as thermal interface materials (TIM) for thermal management. The disclosed technology provides a thermal dissipation structure by using graphene, which may, by way of non-limiting example, take the form of graphene foam (GF)-based thermal interface materials (TIM) as a thermal interface layer. The disclosure provides techniques for manufacturing of thermal interface materials derived from GF, such as the production of GF having metal nanoparticle material added as a mixture component.

The 3D-IPG films are constructed with graphene sheets having a thickness from a few nanometers to hundreds of nanometers. 3D-IPG films, with thickness from a few micrometers to centimeters, are inserted between a heat source and a heat sink to enhance the heat dissipation. The heat source and a heat sink can be any physical structure that emits and absorbs thermal energy, respectively. The interconnected graphene structure allows ultra-high efficiency in heat transfer from heat source to heat sink. The 3D-IPG films can also be a heat sink, heat convector, and heat spreader for high power electronics devices, such as, by way of non-limiting examples, micro-processors and light emitting devices. 3D-IPG materials can be modified or filled by any nanomaterials, thermal conductive fillers or chemical dopants to further enhance the thermal conductivity and decrease the thermal interface resistance. The 3D-IPG materials can be modified with additives, such as metals, carbon fibers, metal oxides, ceramics, to further enhance their mechanical strength. 3D-IPG based thermal management systems can be formed of 3D-IPG materials sealed by encapsulants or sealants. Furthermore, the porous structures of 3D-IPG can be bonded in-between the heat source and heat sink by using a bonding agent.

3D-IPG is produced by a high-temperature chemical vapor deposition (CVD) method from a sacrificial template, and provides porous foam structures constructed by interconnected graphene sheets. The physical deposition conditions allow the 3D-IPG to maintain a high thermal conductivity. The interconnected 3D networking of graphene greatly reduces the interfacial resistance between graphene sheets and facilitates the heat transport both vertically and horizontally. Distinguishing characteristics of 3D-IPG are that the porous film is highly flexible and deformable. While acting as a thermal interface material (TIM), 3D-IPG can easily fill in the gap between the heat source and heat sink. The 3D-IPG can also cap or the small features (up to nanoscale roughened surface) by filling in gaps between peaks of the surface to present a smooth interface. This greatly reduces the thermal resistance between the mating surfaces. Thus 3D-IPG is a superior TIM for thermal management.

3D-IPG films can be produced from high-temperature chemical vapor deposition (CVD), or solution-grown 3D porous graphene oxide/reduced graphene oxides. The CVD can, by way of non-limiting example can be used to apply the 3D-IPG film through templating techniques such as nickel foam or a similar templating technique. The 3D-IPG films, with thickness from a few micrometers to centimeters, are inserted between a heat source and a heat sink to enhance the heat dissipation. The heat source and a heat sink can be any physical structure that emits and absorbs thermal energy, respectively. The interconnected graphene structure allows ultra-high efficiency in heat transfer from heat source to heat sink. The 3D-IPG film, due to its ultra-high thermal conductivity and ultra-high surface area, can also be an effective heat dissipater, heat sink or heat convector. The 3D-IPG film can also be a good heat spreader due to the ultra-high thermal conductivity in the in-plane direction. The various functions of heat dissipater, heat sink, heat convector and heat spreader obtained from use of 3D-IPG film can be applied in thermal management in high power electronics, such as microprocessor or light emitting devices. The 3D-IPG can be modified by any conductive nanomaterials, or chemical dopants to further enhance thermal conductivity and decrease thermal interface resistance.

3D-IPG can be modified with additives, such as metal or carbon fibers, to further enhance its mechanical strength. The 3D-IPG based thermal management system can be sealed by bonding agents or alternatively by encapsulants either with or without the use of bonding agents. The bonding agent is a substance that binds the IPG with heat sink or heat source, whereas the encapsulant searves to seal the IPG within the interface between the heat sink and the heat source. Furthermore, the porous structures of 3D-IPG can be bond in between the heat source and heat sink by using a bonding agent.

Structure

Figure 1:
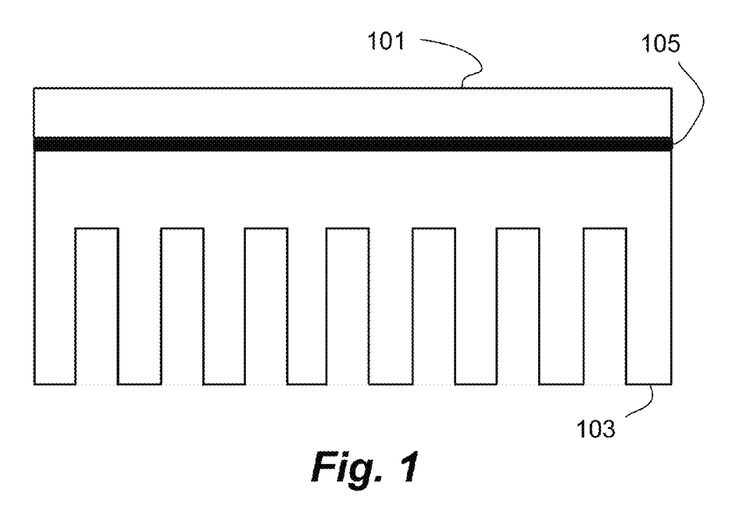
FIG. 1 is a schematic diagram of a thermal dissipation structure where GF-based thermal interface material (TIM) acts as the interface layer.

The disclosed technology provides a thermal dissipation structure by using graphene, which may, by way of non-limiting example, take the form of graphene foam (GF)-based thermal interface materials (TIM) as a thermal interface layer. FIG. 1 is a schematic diagram of a thermal dissipation structure where GF-based TIM functions as the interface layer. Depicted in FIG. 1 are heat source 101 and heat sink 103. A layer of TIM 105 is placed between the heat source 101 and heat sink 103 in order to enhance conductivity between the heat source 101 and heat sink 103, and also to reduce hot spots which may occur at the heat source 101. In a sample used for demonstration, heat source 101 is a section of silicon wafer, which is caused to heat and heat sink 103 is an aluminum heat sink. The TIM 105 is either the graphene foam (GF) or a different material used for comparison purposes. As shown in FIG. 1, the thermal dissipation structure comprises heat source 101, heat sink 102 and GF-based thermal interface layer 103 inserted in-between the heat source and heat sink, and maintained under compressive pressure.

Figure 2:
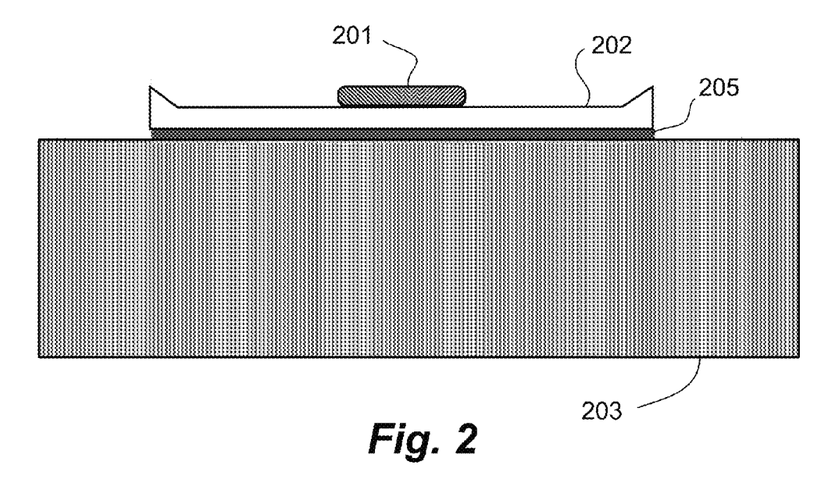
FIG. 2 is a schematic diagram of a practical example of a GF-based thermal dissipation structure, where the heat source is a LED-package.

FIG. 2 is a schematic diagram of a practical example of a GF-based thermal dissipation structure, in which the heat source is a LED-package. Depicted are LED device 201, leadframe 202, which may include driver circuitry, and heat sink 203. In this depiction, the TIM 205 is deposited between the leadframe 202 and the heat sink 203.

Figure 3:
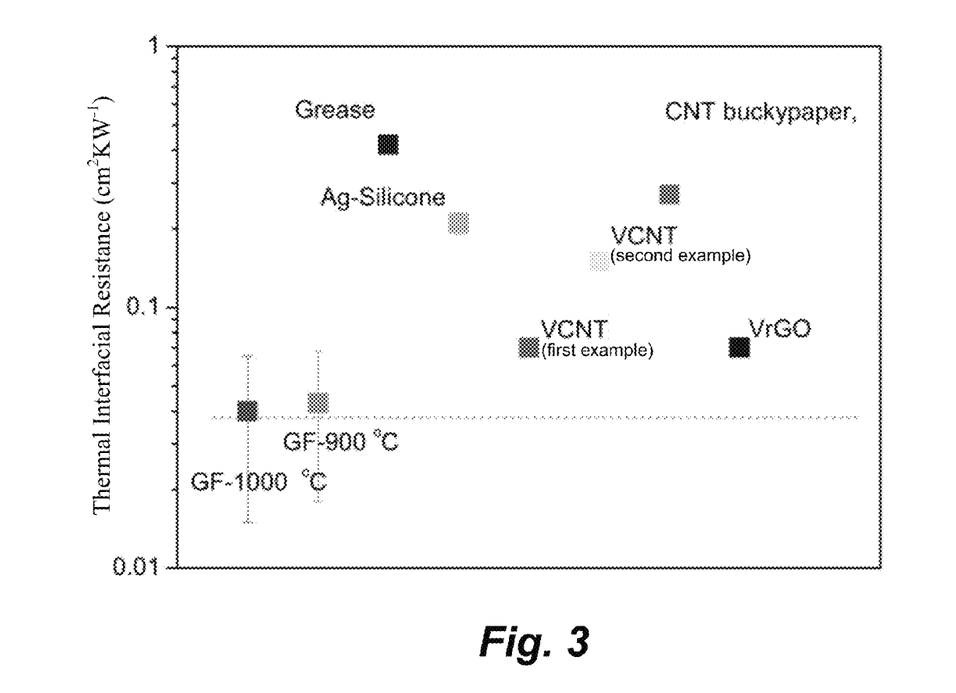
FIG. 3 is a graphic depiction of thermal interfacial resistance of GF at a Si—Al interface as compared with other commonly used particle filled polymer based and carbon-based TIMs.

FIG. 3 is a graphic depiction of thermal interfacial resistance of GF at a Si—Al interface. Thermal resistance (measured in $cm^2$ $KW^{-1}$) is shown at different vertical levels. This is a one-dimensional graph similar to a bar graph, showing the resistances of the different materials. The horizontal dimension only serves to visually separate the representations of the different materials and does not represent an abscissa. Thermal resistance of commercial thermal grease (with nominal thermal conductivity of 0.6 $Wm^{-1}K^{-1}$) and Ag-Silicone paste (with nominal thermal conductivity of 6.4 $Wm^{-1}K^{-1}$) are presented as a benchmark. 3D-IPG has the lowest thermal resistance down to <0.05 $cm^2$ $KW^{-1}$, which is much lower than other commonly used particle filled polymer based TIM (grease and silver-silicone), Thermal interfacial resistance of some other previously reported carbon-based TIMs, including vertical-aligned carbon nanotubes (VCNT), carbon nanotube (CNT) buckypaper, and vertical-aligned reduced graphene oxide paper (VrGO) are also plotted for comparison. It is shown that thermal interfacial resistance was only 0.04±0.02 $cm^2$ $KW^{-1}$ for the GF synthesized at both 900° C. and 1000° C. for 15 minutes.

TABLE I

Thermal interfacial resistance of three dimensional GF-base TIM at Si—Al interface, in comparison with other carbon-based TIMs

| TIM | Thermal Interfacial Resistance ($cm^2KW^{-1}$) | Percentage difference (%) |
|---|---|---|
| GF-900° C. | 0.040 ± 0.025 | — |
| GF-1000° C. | 0.043 ± 0.025 | — |
| VCNT(first example) | 0.07 | 75 |
| VCNT (second example) | 0.15 | 275 |
| CNT paper | 0.27 | 575 |
| VrGO | 0.07 | 75 |

As can be seen, the thermal interface property of the GF provides ultralow thermal interfacial resistance. The low thermal resistance was achieved by inserting the GF in-between a heat source and a heat sink under pressure. Referring to FIG. 3 and Table I, the thermal interfacial resistance of 3D GF has an enhancement of at least ~75% to that of the best reported among carbon-based TIMs. This provides a good thermal management system, in which utilizing GF as TIM layer provides superior thermal dissipation performance. The following are non-limiting examples of the use of 3D-IPG film.

Example—3D-IPG TIM on Silicon Substrate with Bonding Agent

Referring again to FIG. 1, TIM layer 105 is placed between the heat source 101 and heat sink 103 in order to enhance conductivity between the heat source 101 and heat sink 103. TIM layer 105 includes a bonding agent, which is impregnated into the porous structures of 3D-IPG. This integrates the bonding agent with the 3D-IPG for bonding with heat source 101 and heat sink 103. As a result of the bonding, good thermal contact is made between heat source 101 and TIM layer 105 and establishes good thermal contact between TIM layer 105 and heat sink 103.

To demonstrate the utilization of 3D-IPG as a thermal interface layer bonded by binding agents/adhesives, the 3D-IPG was first deposited on a silicon substrate functioning as heat source 101, followed by depositing a binding agent such as epoxy onto the 3D-IPG film 105. Then the silicon with graphene film was attached to heat sink. The thermal management assembly was fixed after curing of epoxy.

The TIM can be constructed by modifying the 3D-IPG filling the 3D-IPG with additives or fillers in order to enhance the thermal conductivity. By way of non-limiting example, the modification can be performed by chemical/electrochemical deposition of metal/metal oxide nanoparticles on the inner walls/pores of 3D-IPG, by infiltration or by physical deposition of conductive metals, metal oxides, ceramics, particles or fibres, conductive polymer or phase change materials on the inner walls/pores of 3D-IPG. The TIM can also be constructed by modifying the 3D-IPG by the use of additives or fillers to enhance the mechanical strength, for example, by coating, infiltration or physical deposition of metals, metal oxides, ceramics, carbon fiber and/or polymers into the porous networking graphene structures.

Example—3D-IPG on Silicon Substrate with Encapsulant

Figure 4:
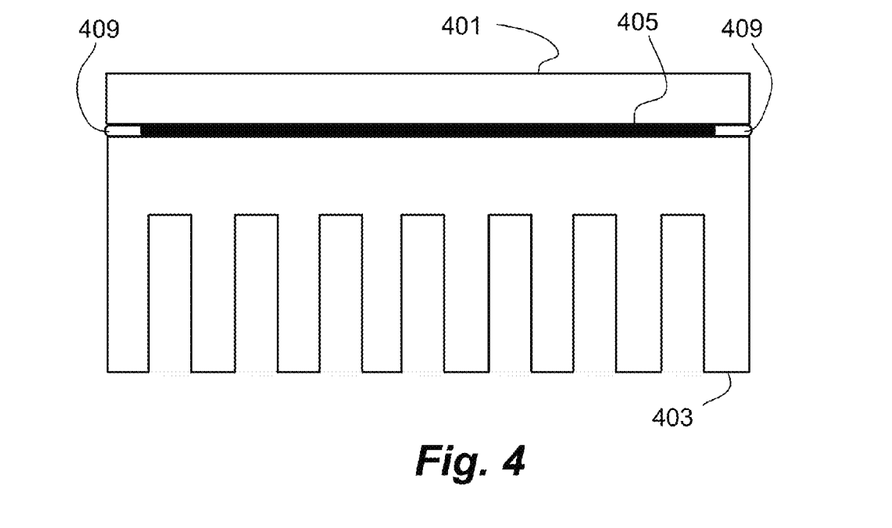
FIG. 4 is a schematic diagram of a thermal management system based on 3D-IDG TIM with an encapsulant layer.

FIG. .x4 is a schematic diagram of a thermal management system based on 3D-IDG TIM with an encapsulant layer. Depicted are heat source 401, and heat sink 403. As is the example of FIG. 1, a layer of TIM 405 is placed between heat source 401 and heat sink 403 in order to enhance conductivity between heat source 401 and heat sink 403. Also, as in the example of FIG. 1, the thermal dissipation structure comprises heat source 401, heat sink 403 and GF-based TIM 405 inserted in-between the heat source and heat sink, and maintained under compressive pressure. TIM 405 does not fully extend to the edge of the interface, and encapsulant material 409 covers the edges of the interface. Interface layer may including bonding material as described above and/or may be mechanically compressed between heat source 401 and heat sink 403.

The depiction of FIG. 4 is essentially a cross-sectional view, in two dimensions; however, in most but not all cases, encapsulant material 409 will extend around the perimeter of the interface so as to seal or substantially seal TIM layer 405.

To demonstrate the utilization of 3D-IPG as a thermal interface layer sealed with encapsulants, the 3D-IPG was directly deposited on a silicon substrate to mimic a semiconductor chip as heat source 401. The silicon was then attached to a heat sink, such as an aluminum plate as heat sink 403, to form a thermal management system in which 3D-IPG acts as TIM 405. The periphery of TIM 405 layer was coated with an encapsulant 409 such as silicone.

Production Method

By way of non-limiting example, 3D graphene is produced by chemical vapor deposition growth of graphene onto commercial available porous Ni foam. The Ni foam acts as a sacrificial template for graphene deposition.

Figure 5A:
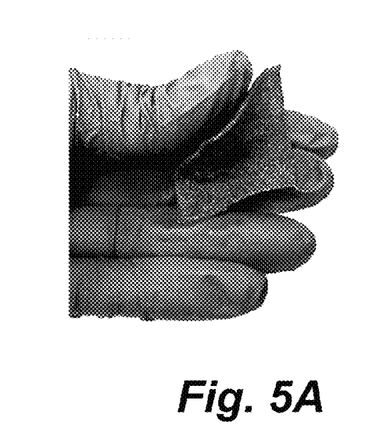
FIG. 5A is a photographic image of a free-standing 3D-IPG film.
Figure 5B:
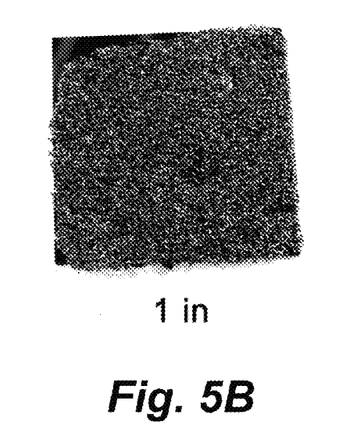
FIG. 5B is an image of a 3D-IPG film supported on a silicon wafer.

FIGS. 5A and B are photographs of GF film. FIG. 5A is a photographic image of a free-standing 3D-IPG film. FIG. 5B is an image of a 3D-IPG film supported on a silicon wafer. The graphene-supported Ni foam was treated with etchant (such as hydrochloride acid, ferric nitrate) to remove the Ni backbone and free-standing graphene porous film was produced, as shown in FIG. 5A. This graphene film can be transferred onto any solid substrate acting as heat source or heat sink. FIG. 5B shows the typical 3D-IPG film transferred onto a 1 inch silicon wafer. The 3D-IPG film can also be made by solution-grown aerogel from graphene oxides or reduced graphene oxides. Typically, graphene oxides or reduced graphene oxides were treated in solvents under high temperature and assembled into 3D porous interconnected films.

A sample 3D-IPG film was characterized by scanning electron microscopy (SEM). From the SEM images shown in FIGS. 6A and 6B, it is clearly shown that the IPG film was constructed from interconnected graphene sheets with the width of ~50 μm and length of several hundred μm, to form the porous foam-like structure. The graphene sheets were featured with some foldings and corrugations, indicating the strong flexibility and conformability of 3D-IPG film to the mating surface, which is benefit to enhance the thermal transport power of 3D-IPG based TIM.

FIGS. 5A and 5B are images of 3D-IPG film. FIG. 5A is a photographic image of a free-standing 3D-IPG film. FIG. 5B is an image of a 3D-IPG film supported on a silicon wafer. The thermal resistance of 3D-IPG was tested by using the ASTM standard (ASTM-D5470). Generally, the 3D-IPG was transferred onto a 1 inch (2.5 cm) square silicon wafer (mimicking a semiconductor chip as a heat source) and covered on top by the 1 inch square (25 mm$^2$) aluminum plate (mimicking the heat sink). The thermal testing assembly was then inserted into the TIM tester for the test.

Figure 6A:
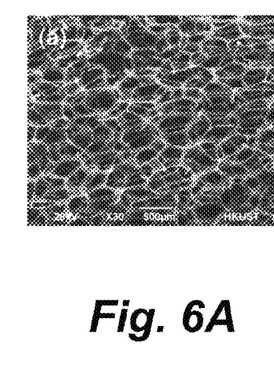
FIGS. 6A and 6B are SEM images of the 3D-IPG film.
Figure 6B:
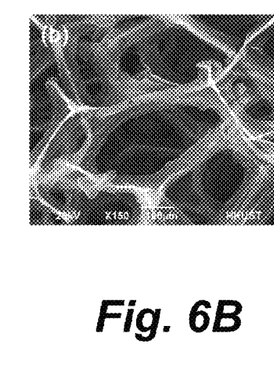

FIGS. 6A and 6B are SEM images of the 3D-IPG film. These figures show the images of the free-standing 3D-IPG film before having been assembled into the testing assembly.

Figure 7A:
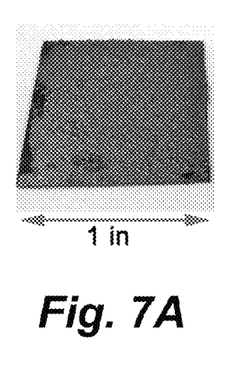
FIG. 7A shows the silicon and FIG. 7B shows the aluminum plate.
Figure 7B:
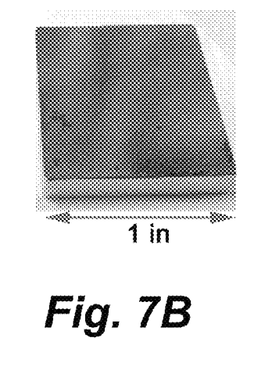

FIGS. 7A and 7B are SEM images of the 3D-IPG film. The thermal management systems utilizing 3D-IPG as a thermal interface layer may be sealed with encapsulants or bonded by binding agents/adhesives. The images of FIGS. 7A and B show the materials after disassembly following a thermal resistance test during which the 3D-IPG was left on a 1 inch (2.5 cm) square silicon wafer. FIG. 7A shows the silicon and FIG. 7B shows the aluminum plate. The 3D-IPG was left on the 1 inch square silicon wafer.

Example—LED Package

Figure 8:
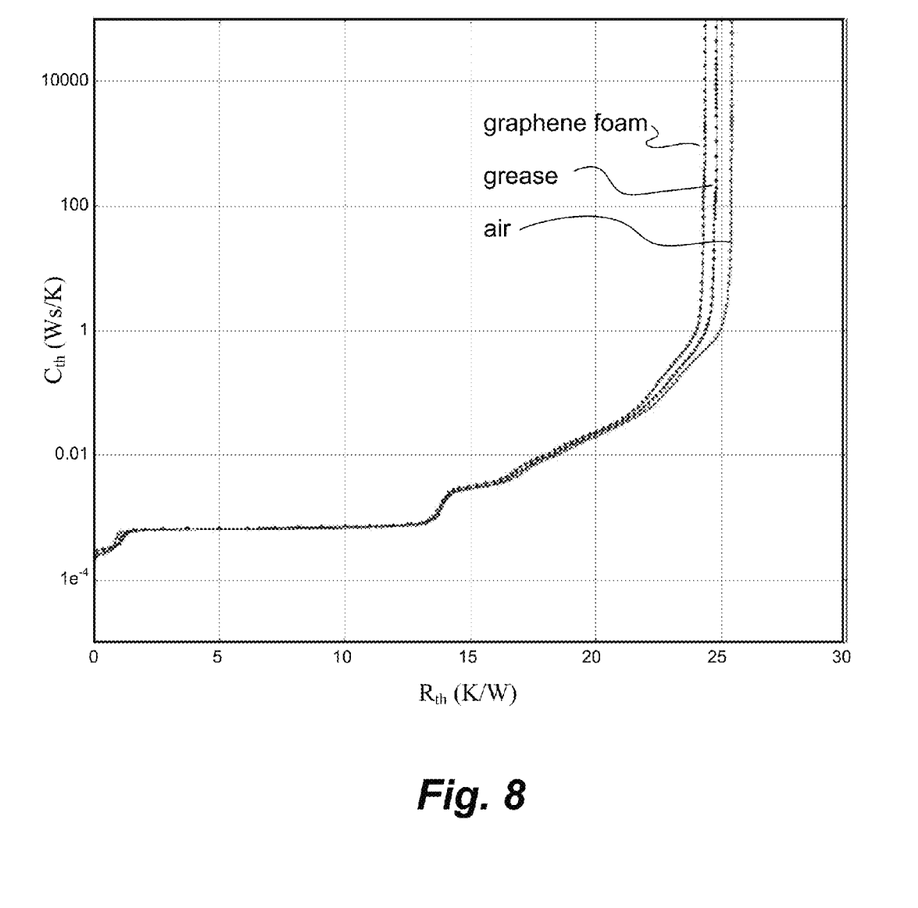
FIG. 8 is a graph showing cumulative structure functions of LED-packages with different TIM layer.

FIG. 8 is a graph showing cumulative structure functions of LED-packages with different TIM layer: GF (left line on the right side of the graph), air (right line on the right side of the graph), and thermal grease (center line on the right side of the graph).

The performance of GF-based TIM for heat dissipation of a LED-package was tested by a T3ster system. The power of the LED chip is 0.1 W and the size of package is 1×2.3 cm$^2$. The LED-package was fixed on a heat-sink with a GF inserted in-between. The total thermal resistance of the package was measured in pulse mode. The thermal resistances of the package with air and thermal grease were tested for comparison. FIG. 8 shows the cumulative structure functions of the package with different TIM layers.

It is seen from FIG. 8, the total thermal resistance of the LED-package with GF is the lower than that of the thermal grease. The thermal grease decreased the thermal resistance of ~0.61K/W, while the GF decreased the total thermal resistance of ~1.07 K/W. $C_{th}$ is thermal capacitance and its unit is Ws/K. $R_{th}$ is the thermal resistance and its unit is K/W. Taken into consideration of the contact area of GF ~2.3 cm$^2$, the thermal interfacial resistance of the LED-package has a decrease of about 2.46 cm$^2$K/W with GF as a TIM layer, which is of ~75% enhancement to that of the thermal grease. The result clearly demonstrates the great potentials of GF in acting as TIM layer within a thermal dissipation system.

CONCLUSION

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A composite structure comprising:
   a thermal interface material for increasing thermal conduction or thermal dissipation across an interface between a heat source and a heat sink, the thermal interface material comprising:
   the heat source;
   the heat sink;
   an interface with the heat source, the heat source transmitting heat to the thermal interface material;
   an interface with the heat sink, the heat sink accepting heat across the thermal interface material for dissipation from the thermal interface material to the heat sink;
   a three-dimensional interconnected porous graphene (3D-IPG) foam structure constructed of three-dimensional interconnected porous graphene sheets formed as a plurality of layers between the interface with the heat source and the interface with the heat sink, the graphene sheets having an flexible interconnection architecture, and arranged as an interface layer to reduce thermal resistance between mating surfaces, under compressive pressure, when maintained under said compressive pressure, thereby providing high interfacial thermal conductance and a high interface contact area, said interface layer not fully extending to the edge of the interface; and
   an encapsulant material extending around a perimeter of the interface so as to seal or substantially seal the interface layer, so that the encapsulant material covers the edges of the interface,
   wherein the flexible interconnection architectures allow the 3D-IPG to maintain a high interfacial thermal conductance or thermal dissipation by the 3D-IPG filling a gap between the heat source and the heat sink across the interface layer, and by capping small features up to nanoscale roughened surfaces.

2. The composite structure of claim 1, wherein the creating a pressure insensitive thermal interfacial resistance, in turn results in the 3D-IPG functioning as an effective heat dissipater, heat sink or heat convector.

3. The composite structure of claim 1, further comprising:
   the interconnected graphene sheets produced by constructing the 3D-IPG films with graphene sheets having a thickness range of approximately 1 nm to approximately 10 nm.

4. The composite structure of claim 1, further comprising:
   the graphene sheets produced from high-temperature chemical vapor deposition (CVD) based templating formed from a sacrificial template.

5. The composite structure of claim 1, further comprising:
   the graphene sheets produced from high-temperature chemical vapor deposition onto porous Ni foam to produce graphene-supported Ni foam, with the Ni foam acting as a sacrificial template for graphene deposition, and the graphene-supported Ni foam treated with etchant to remove the Ni and leave free-standing porous graphene film, followed by transferring the graphene film onto a substrate acting as heat source or heat sink.

6. The composite structure of claim 1, further comprising:
   the graphene sheets produced from solution-grown 3D porous graphene oxide or reduced graphene oxides.

7. The composite structure of claim 1, further comprising the 3D-IPG modified or filled by at least one of the group consisting of an additive or filler, said additive or filler enhancing at least one of thermal conductivity and mechanical strength.

8. The composite structure of claim 7, wherein the additive or filler comprises a material applied by chemical/electrochemical deposition of metal/metal oxide nanoparticles on the inner walls/pores of the 3D-IPG; by infiltration or by physical deposition of conductive metals, metal oxides, ceramics, particles or fibers, conductive polymer or phase change materials on the inner walls/pores of 3D-IPG.

9. A method of producing the composite structure of claim 1, the method comprising:
   providing a three-dimensional interconnected porous graphene (3D-IPG) foam structure constructed of three-dimensional interconnected graphene sheets formed as a plurality of monolayers by chemical vapor deposition (CVD) from a sacrificial template, the graphene sheets having an interconnection architecture;
   placing the 3D-IPG porous foam structure at an interface between a heat source and a heat sink and applying pressure across the interface, said 3D-IPG porous foam not fully extending to the edge of the interface; and
   providing the encapsulant material extending around the perimeter of the interface so as to seal or substantially seal the interface layer,
   wherein the 3D-IPG foam structure provides a flexible interconnection architectures, allowing the 3D-IPG to maintain a high interfacial thermal conductance by the 3D-IPG filling a gap between a heat source and a heat sink across the interface, thereby reducing thermal resistance between the mating surfaces and providing high thermal conductivity and a high interface contact area to 3D-IPG function as an effective heat dissipater, heat sink or heat convector.

10. The method of claim 9, further comprising:
    using the deposition conditions to allow the 3D-IPG to maintain a high thermal conductivity; and
    using the 3D-IPG as an interface by filling the gap between the heat source and the heat sink across the interface, and by capping small features up to nanoscale roughened surfaces, thereby reducing thermal resistance between the mating surfaces, thereby providing high interfacial thermal conductance and a high interface contact area, and creating a pressure insensitive thermal interfacial resistance.

11. The method of claim 9, further comprising:
    constructing the 3D-IPG films with graphene sheets having a thickness range of approximately 1 nm to approximately 10 nm.

12. The method of claim 9, further comprising:
producing the interconnected graphene sheets from high-temperature chemical vapor deposition based templating.

13. The method of claim 9, further comprising:
producing the interconnected graphene sheets from high-temperature chemical vapor deposition onto porous Ni foam to produce graphene-supported Ni foam, with the Ni foam acting as a sacrificial template for graphene deposition, and the graphene-supported Ni foam treated with etchant to remove the Ni and leave free-standing graphene porous film, followed by transferring the graphene film onto a substrate acting as heat source or heat sink.

14. The method of claim 9, further comprising:
producing the interconnected graphene sheets from solution-grown 3D porous graphene oxide or reduced graphene oxides.

\* \* \* \* \*